United States Patent [19]

Sano et al.

[11] Patent Number: 4,942,359
[45] Date of Patent: Jul. 17, 1990

[54] METHOD OF MAGNETIC RESONANCE IMAGING

[75] Inventors: Koichi Sano, Sagamihara; Tetsuo Yokoyama, Tokyo; Hideaki Koizumi, Katsuta, all of Japan

[73] Assignee: Hitachi, Ltd., Tokyo, Japan

[21] Appl. No.: 301,901

[22] Filed: Jan. 25, 1989

[30] Foreign Application Priority Data

Jan. 29, 1988 [JP] Japan .................................. 63-17078

[51] Int. Cl.⁵ ............................................ G01R 33/20
[52] U.S. Cl. ..................................... 324/309; 324/307
[58] Field of Search ............... 324/300, 307, 308, 309, 324/310, 311, 312, 313, 314, 306; 128/653

[56] References Cited

U.S. PATENT DOCUMENTS

| | | | |
|---|---|---|---|
| 4,661,775 | 4/1987 | Kormos | 324/307 |
| 4,706,027 | 11/1987 | Hughes | 324/309 |
| 4,789,833 | 12/1988 | Nishimura | 324/309 |

Primary Examiner—Michael J. Tokar
Attorney, Agent, or Firm—Antonelli, Terry, Stout & Kraus

[57] ABSTRACT

An MR imaging method comprising detecting resonant signals from a portion including blood vessels by the three-dimensional imaging incorporating depthwise information, and performing subtraction, with respect to the signal data in each voxel in the complex number representation, between the image data obtained by adding the complex numbers in the projection direction and the image data obtained by adding the absolute values of the complex numbers in the projection direction, to extract the image of only the blood vessel.

12 Claims, 5 Drawing Sheets

METHOD OF MAGNETIC RESONANCE IMAGING

BACKGROUND OF THE INVENTION

This invention relates to the imaging method utilizing the magnetic resonance (MR), and more particularly to an MR imaging method for scanning of a cross-section of a living subject, adapted to a method of visualizing of blood vessels.

Techniques of angiograhy by utilizing the magnetic resonance are disclosed in detail in IEEE, TRANSACTIONS ON MEDICAL IMAGING, VOL. MI-5, No. 3 (1986) pp. 140–151.

Basically, there are two methods; subtraction method and cancellation method. In both methods, pulses called flow encode pulses are applies to a moving fluid in a direction in coincidence with the flow component direction of the fluid.

The flow encode pulses are added not to give affects to the gradient magnetic field which is usually used for taking a tomography picture. The flow encode pulses are two gradient magnetic fields of the same magnitude and the positive and the negative polarities. After the gradient magnetic field of the positive polarity is applied, the gradient magnetic field of the negaive polarity is applied after the lapse of a predetermined time. When the flow encode pulses are applied to a stationary subject, the phase of a spin is first varied by the positive gradient magnetic field and then is returned to the original position by the negative gradient magnetic field. Thereby, the phases are aligned as the result and when the phases are aligned the signals are detected. Where as when the flow encode pulses are applied to a moving fluid such as blood in the same direction as the flow direction component, the spins do not receive the action of the same magnitude by the negative gradient magnetic field as the spin changes which they received by the positive gradient magnetic field, since the spins which are given phase shifts by the positive gradient magnetic field change their position by the flow. Therefore, the phase shifts are not completely cancelled and there remain phase shifts of the magnitude corresponding to the difference of the positive and the negative gradient fields. Further, since the blood flow is a laminar flow, the changes of the phase shifts are different at every position in a blood vessel and the phase are dispersed and not aligned. When the phases are not aligned, the resonance signal becomes weak. Thus, the spins of a fluid cause phase changes after the application of the positive and the negative gradient magnetic fields. Discrimination of the fluid from the stationary portions can be done by detecting the changes of the resonance signal by those phase changes. Thereby, blood vessels can be imaged.

Based on this principle, in the subtraction method, subtraction is done between the reconstruction images of the flow-sensitive sequence including the flow encode pulse and the flow insensitive sequence not including the flow encode pulse. In the blood vessels, blood flows in laminar flow as shown in FIG. 4B. Therefore, when a tomography is taken in the flow-sensitive sequence, different phase changes arise in various positions in the blood vessel and the projection data integrating those results produces no signal from the blood vessel by the mutual cancellation.

In the stationary portion, since the changed phase is returned to the original position, the resonant signal is detected when the phases are aligned.

On the other hand, in the flow-insensitive sequence, similar resonant signals are obtained from the flowing portion and from the stationary portion.

When subtraction is made between the two sequences, the stationary portions disappear and the blood vessel portions which are the difference of the two sequences appear.

The cancellation method is a method of obtaining a blood vessel image by one measurement. Upon exciting the spin, an RF pulse corresponding to a 360° pulse having an intensity of four times as strong as a 90° RF pulse is applied, and a flow encocde pulse is applied simultaneously. In the stationary portion, the spins are returned to the original positions and no signal is generated. In the moving portion, however, the phases are changed by the flow encode pulse and hence a signal is generated. Thus, when the observation signals are converted into a picture, only the blood vessels are obtained.

Those related arts, however, are insufficient with respect to the treatment of the laminar flow. Namely, when a laminar flow is measured as a projection data, good signals are not necessarily derived from blood vessels. First, in the subtraction method, it is assumed that the phases in the blood vessels do not change in the flow-insensitive sequence not including the flow encode pulse. This assumption holds only for a flow of a constant velocity. In the actual blood flow in arteries, however, the flow velocity changes rapidly in synchronism with the contraction of the heart and hence includes acceleration components which vary the velocity with the time. Therefore, being different from the case of a flow of a constant velocity, there arise phase changes. Further, even if the magnitude of the velocity is constant, when the blood vessel is curved, the blood flow therein will include the acceleration component and also produce the phase change. Therefore, even when an image is taken in the flow-insensitive sequence, the resonance signal in the blood vessel is weakened by the phase change.

Therefore, it has been difficult to extract arteries of complicated shape in the head such as medium and large brain arteries. Further, the subtraction method requires two picture-taking processes, flow-insensitive and flow-sensitive, and hence requires a long time for measurement. Especially, a long measurement time is required for the three dimensional imaging method which requires many sheets of depthwise information.

On the other hand, in the cancellation method, the flow sensitive sequence is basically used. Even when signals are generated only from moving spins, signals from a laminar flow cancel each other because of the phase differences in the laminar flow. As the result, the resonant signal becomes very weak and it has been basically difficult to extract the arteries in the brain.

SUMMARY OF THE INVENTION

An object of this invention is to provide an imaging method capable of extracting blood vessels of complicated shape in which the blood flow velocity rapidly changes, as the arteries in the brain.

According to this invention, computer-processing is carried out as explained below upon three dimensional picture elements obtained. The projection data of the blood vessel portion are calculated by software to obtain an image.

(The First Method)

1. The signals of the respective voxels (three dimensional picture elements) in a complex number are added in the projection direction.
2. The absolute values of the signals of the respective voxels are obtained and added in the projection direction.
3. substraction is done between these two kinds of the projection data to extract the blood vessel.

(The Second Method)

1. In each voxel, subtraction is done between the absolute value of the signal in the complex number and the value of the complex number and the real part thereof is taken.
2. The obtained real parts are added in the projection direction to extract the blood vessel.

According to this invention, the following features are obtained.

(1) Measurement is done through the three dimensional data, and hence images of the blood vessel from various angles can be reconstructed once the measurement is done. Also, it is possible to give a three dimensional display.

(2) Since subtraction is done in one kind of data, there is no need to do two picture takings as in the subtraction method described above. Therefore, the measurement time can be reduced and also there is no fear of position shifts.

(3) The influence of the laminar flow can be removed by raising the resolution of the image. Therefore, this method is fundamentally superior as the imaging method for the blood vessels, especially for the arteries.

Concerning the method for obtaining voxels, observation of the blood vessel by slicing a thickness including the whole blood vessel portion and taking the projection data as employed in the above-mentioned related art is not done. A blood vessel is divided with a plurality of slices with respect to the depthwise direction according to the invention. Measurement is done by the three-dimensional imaging method to include much information regarding the depthwise direction of the blood vessel.

DESCRIPTION OF THE PREFERRED EMBODIMENTS

Figure 4A:
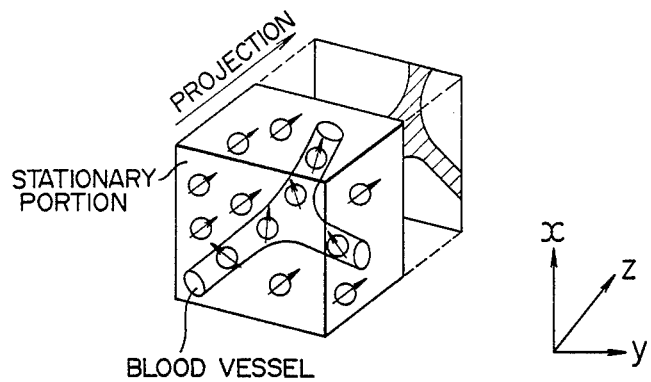
FIGS. 4A and 4B are diagrams illustrating the principle of this invention.
Figure 4B:
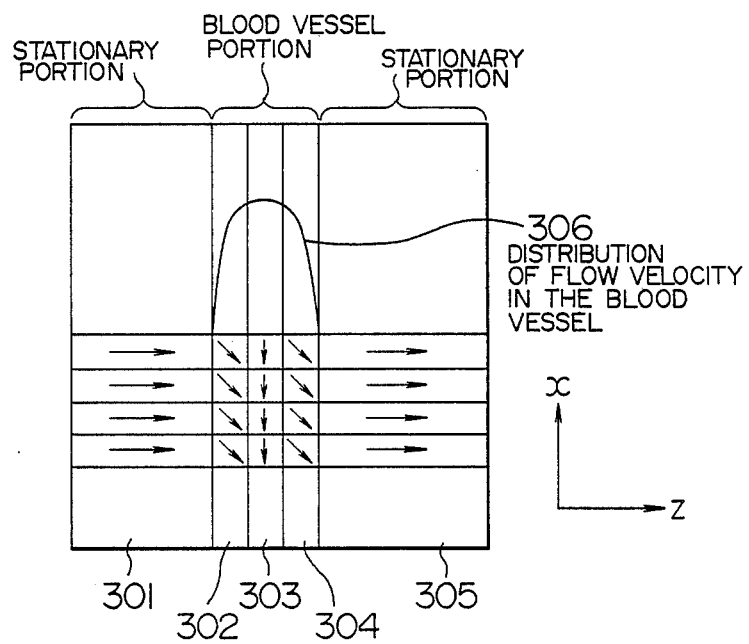

The coordinate system is set as shown in FIG. 4A. The direction along which the data are projected is set as z axis, the lateral direction in the drawing is set as y axis, and the vertical direction in the drawing is set as x axis. For simplifying the statement, a simple one-dimentional model shown in FIG. 4B is used for explanation.

Figure 5:
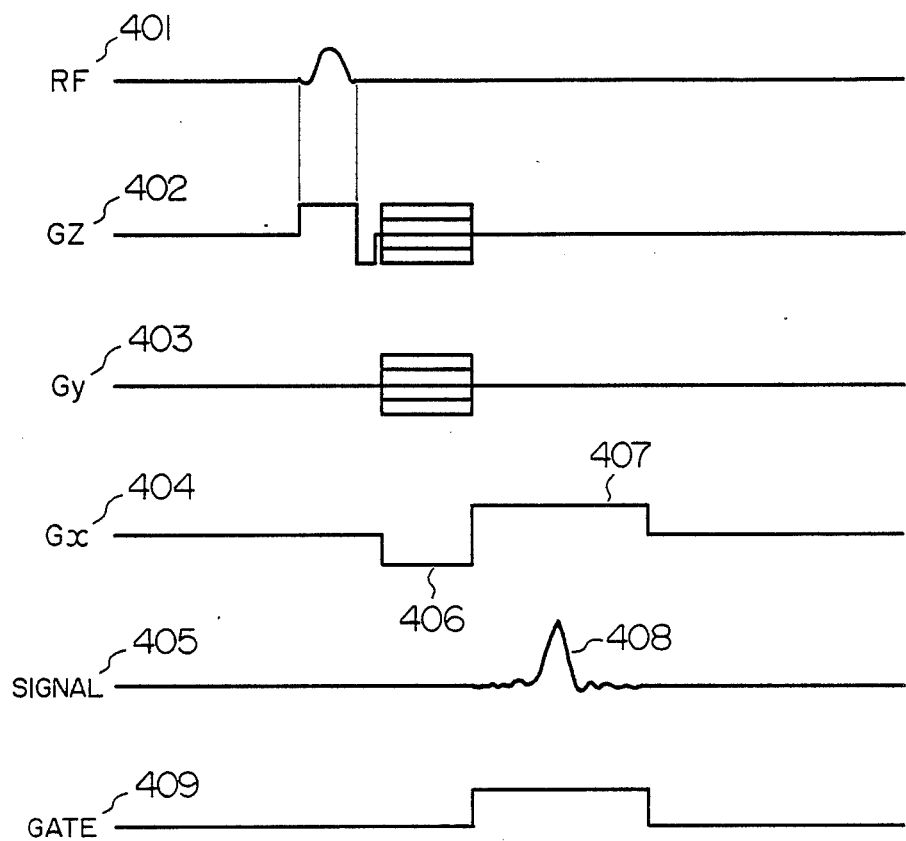
FIG. 5 is waveforms of an example of pulse sequence according to this invention.

The picture-taking processing is done along the typical sequence shown in FIG. 5.

The nuclear spins in the stationary portions 301 and 305 do not move and hence produce no phase shifts in the observed signals. In the blood vessel, however, since there exist positive and negative flow encode pulses 406 and 407 as shown in FIG. 5, the phase of a spin is varied according to its velocity. In the blood vessel, blood flows in a laminar flow with different velocities for the respective layers. For example, the phases vary in the layers 302, 303 and 304 as shown in FIG. 4B.

Letting the signals of the stationary portions 301 and 305 be $S_1$ and $S_2$, the signals of the blood vessel layers 302, 303 and 304 be $B_1$, $B_2$ and $B_3$ and the phases of the Larmor precession after excitation be $\theta_1$, $\theta_2$ and $\theta_3$ the addition of the real parts, while keeping the phases of the respective voxels, will give $$A_1 = S_1 + \sum_{i=1}^{3} B_1 \cos \theta_i + S_2. \tag{1}$$

On the other hand, the additon of the absolute values will give $$A_2 = S_1 + \sum_{i=1}^{3} B_i + S_2. \tag{2}$$

Then, the subtraction between these signals will erase the stationary portions and retain only the signals on the blood vessel as shown the equation (3).

$$R = A_2 - A_1 = \sum_{i=1}^{3} B_i (1 - \cos i). \tag{3}$$

In practice, however, the phases in equation (1) including the stationary portions are rotated due to the non-uniformity in the magnetic field and the delay in the switching time upon turning on and off the gradient field. Thus, correction of such phase distortion becomes necessary in the addition of the real parts. For example the correction method disclosed in U.S. Pat. No. 4736160 granted on Apr. 5, 1988 can be employed.

Hereinbelow, the invention will be described in more detail based on the embodiments.

Figure 3:
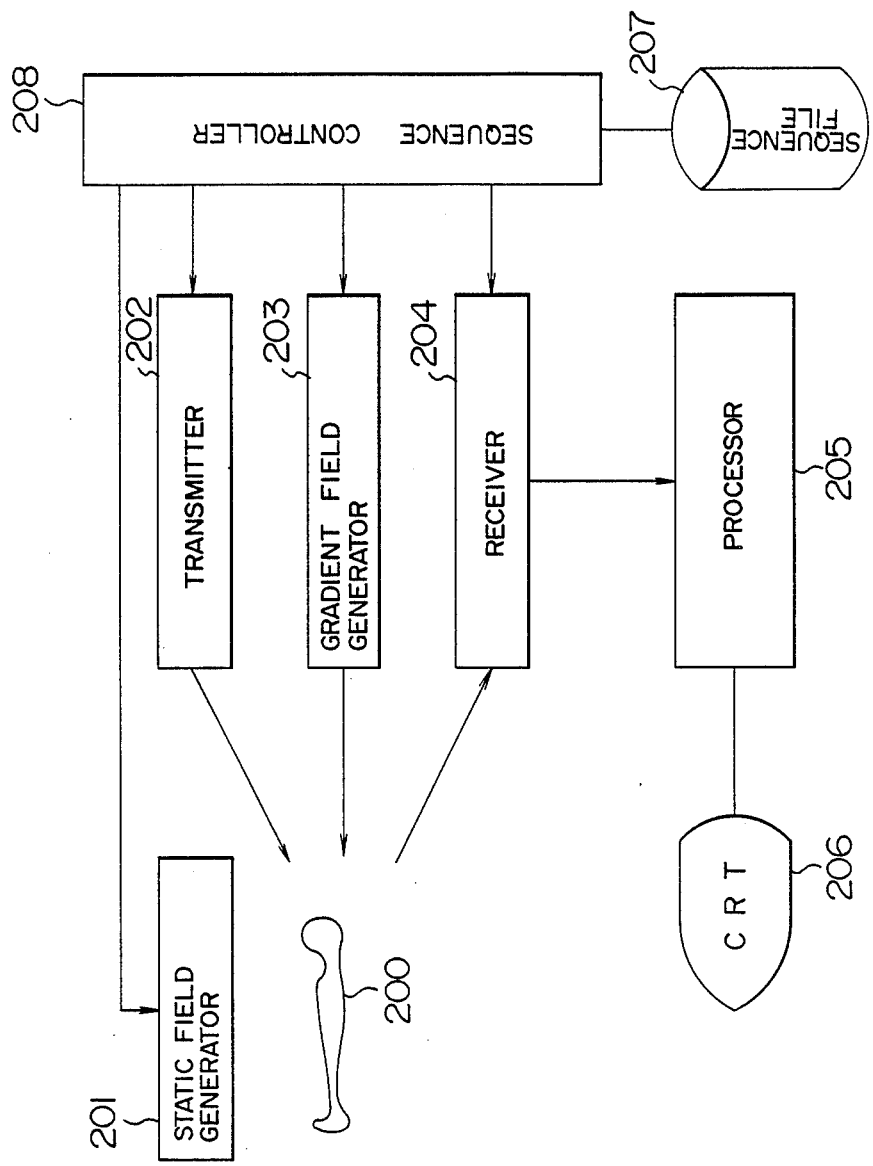
FIG. 3 is a block diagram of a structure according to this invention.

FIG. 3 is a block diagram of the structure of an embodiment of this invention. A subject 200 to be inspected or measured is excited by a static magnetic field generating system 201 for generating a uniform static magnetic field, a transmission system 202 for generating RF pulses for exciting spins, and a gradient magnetic field generating system 203 capable of varying the intensity of the magnetic field linearly and independently in the respective x, y and z directions. The electromagnetic waves generated from the subject under measurement are received by a receiver system 204, and A/D-converted after detection. The processor 205 perform various operations required for image reconstruction, based on the measurement data from the receiver system 204. The result of reconstruction is displayed in a CRT 206. The control procedures of the actions of the respective systems in the above-mentioned structure are stored in a pulse sequence file 207. A sequence controller 208 controls the action timings of the respective systems based on the control procedures stored in the pulse sequence file 207.

An example of the pulse sequence for practicing this invention is shown in FIG. 5. This pulse sequence is preliminarily stored in the sequence file 207 and gives the action timing information to the sequence controller 208.

This sequence is for the three-dimentional imaging generally used in ordinary systems. In FIG. 5, a waveform RF 401 denotes the timing for applying RF pulse generated in the transmitter 202, and waveforms Gz 402, Gy 403 and Gx 404 show the timing charts for applying the gradient fields in x, y and z directions, espectively. A positive and a negative pulse in Gz 402 before the application of the gradient field corresponding to the flow encode pulse are excitation pulses for selecting a slice plane in the subject to be measured. A waveform signal 405 is a time chart showing the measured signal 408. A waveform Gate 409 is a time chart for receiving the measured signal 408. Here, since signals Gx 406 and 407 serve the role of the flow encode pulse, phase changes are generated in the respective spins of the fluid when there is a movement component in the x direction. The phases of the spins in the stationary portions of the subject to be inspected are varied by the negative gradient field Gx 406, but are returned to the original positions by the positive gradient field Gx 407. When the areas of the positive and the negative gradient fields are equal, the phases are perfectly returned to the original positions, i.e. in the state of inphase. At this time, the largest resonance signal is detected. Regarding the spins in the x direction in the blood vessel, the phases are not aligned due to the phase changes and the laminar flow, no signal is detected.

Since the respective gradient fields are mutually exchangeable, Gx and Gy in FIG. 5 may be exchanged when a blood vessel extends in the y direction. The lattice-shaped mark ▤ in Gz 402 and Gy 403 representing a gradient field denotes that gradient fields of different intensities are applied for separating the positions in the z and y directions respectively in every measurement.

Figure 1:
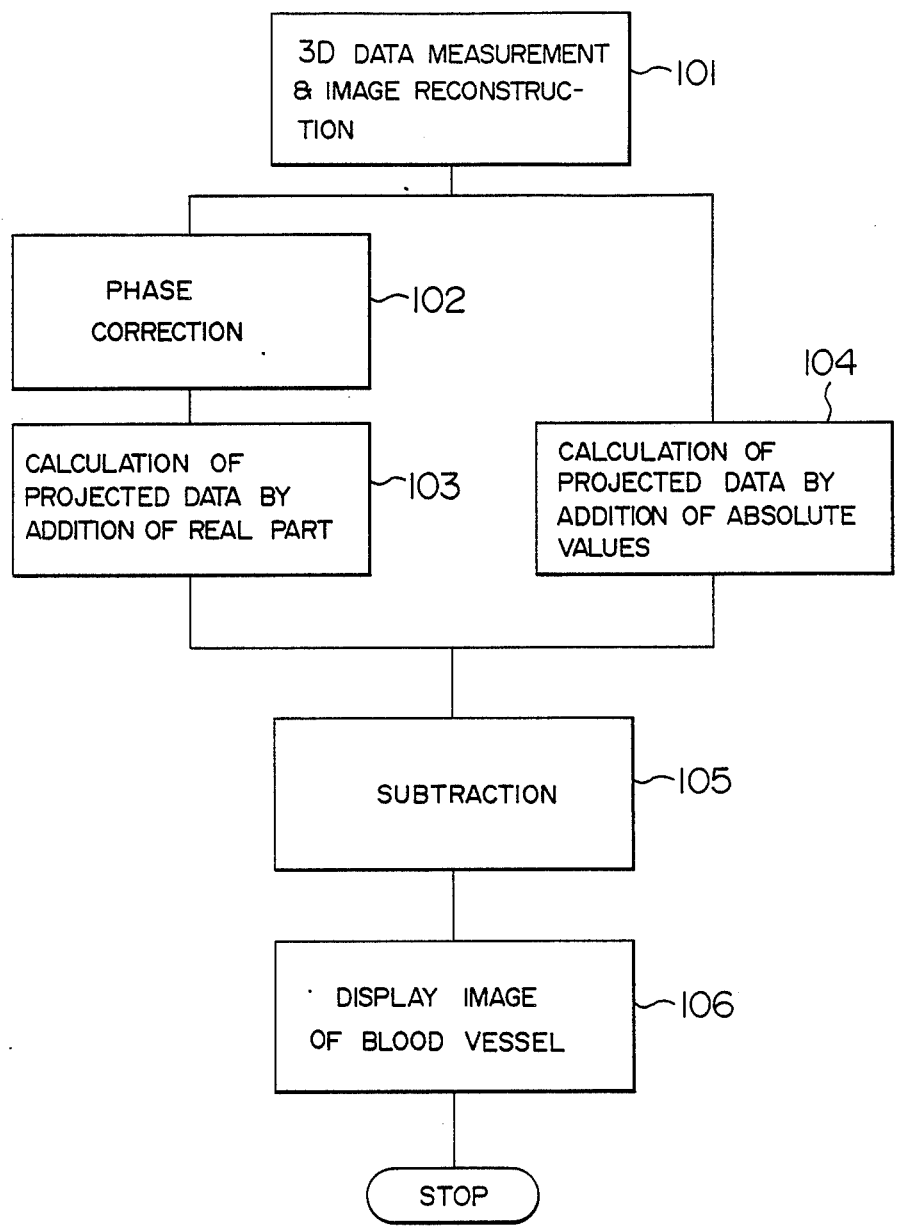
FIG. 1 is a flow chart showing an example of the processing according to this invention.

The procedures of this invention in the above-mentioned structure will be explained referring to FIG. 1.

Step 101: Data are measured based on the pulse sequence of FIG. 5. Three-dimensional image is obtained through the three-dimensional Fourier transformation.

Step 102: Correction processing for the phase distortion in the system is done on the reconstructed image.

Step 103: Only the real parts of the signal data of the respective picture elements in the complex number are added along the direction along which the projection is desired, to provide added real parts data.

Step 104: Absolute values of the data are added in the same direction as the above step 103, to provide added absolute vaues data.

Step 105: Subtraction is carried out between the images obtained in the steps 103 and 104.

Step 106: The result of subtraction is displayed as the blood vessel.

Figure 2:
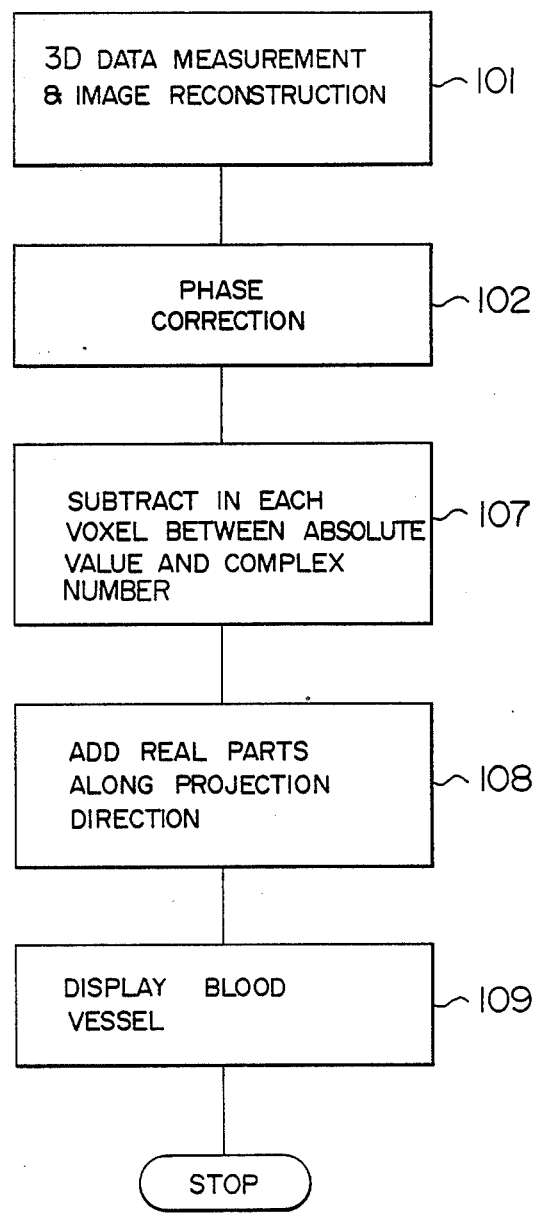
FIG. 2 is a flow chart showing another example of the processing according to this invention.

FIG. 2 shows another embodiment of this invention. Steps 101 and 102 are similar to those of FIG. 1.

Step 107: Subtraction is done between the absolute values and the complex number of the signal represented in the complex number in each voxel.

Step 108: The real parts of the complex obtained by the subtraction are added along the projection direction.

Step 109: The result of addition is displayed as the blood vessel.

The addition carried out in steps 103, 104 and 108 means, for example, the addition among the data which are more than a predetermined threshold value or the addition anong the data representing maximum value besides the ordinary addition among all the data.

The addition among the limited data produces an advantageous effect of eliminating noise.

According to this ivention, since the depthwise direction is finely sliced in the excitation, it enables the measurement of data of one blood vessel by dividing it with a plurality of slice planes parallel to the direction of blood flow. Thereby, even thin blood vessels can be measured.

Further, by inputting the measurement data into a three-dimensional display device such as a computer graphics system, the difference of the real part of the complex number data and the absolute value of the complex number data can directly be displayed three-dimensionally.

We claim:

1. A method of magnetic resonance imaging comprising the steps of:
   (a) applying a static magnetic field, gradient magnetic fields and a radio frequency magnetic field to a subject to be measured, and detecting nuclear magnetic resonance signals from the subject to be measured;
   (b) reconstructing first image signal data by performing calculations using complex numbers indicative of the detected signals;
   (c) obtaining first projection data by processing the first image signal data along a projection direction;
   (d) calculating second image data by performing calculations using absolute values of the first image signal data;
   (e) obtaining second projection data by processing the second image signal data along the projection direction; and
   (f) obtaining image data of blood flow of the subject to be measured by performing subtraction between the first projection data and the second projection data.

2. A method of magnetic resonance imaging according to claim 1, wherein said step of applying and detecting includes a step of detecting said resonance signals by a three-dimensional imaging method by which the depthwise direction of said subject to be measured in divided with a plurality of slice planes.

3. A method of magnetic resonance imaging according to claim 2, further comprising the step of correcting phase distortions for the first image signal data represented in complex numbers.

4. A method of magnetic resonance imaging according to claim 1, wherein said steps (c) and (e) of processing include an addition step.

5. A method of magnetic resonanace imaging according to claim 4, wherein said step of applying and detecting includes a step of detecting said resonance signals by a three-dimensional imaging method by which the depthwise direction of said subject to be measured ia divided with a plurality of slice planes.

6. A method of magnetic resonance imaging according to claim 5, further comprising the step of correcting phase distortions for the first image signal data represented in complex numbers.

7. A method of magnetic resonance imaging comprising the steps of:
   (a) applying a static magnetic field, a gradient magnetic field and a radio frequency magnetic field to a subject to be measured, and detecting nuclear magnetic resonance signals from the subject to be measured;

(b) reconstructing first image signal data by performing calculations using complex numbers indicative of the detected signals;

(c) calculating second image signal data by performing calculations using absolute values of the first image signal data;

(d) obtaining third image signal data by performing subtraction between the first image signal data and the second image signal data; and (e) obtaining image data of blood flow of the subject to be measured by processing the third image signal data along a projection direction.

8. A method of magnetic resonance imaging according to claim 7, wherein said step of applying and detecting includes a step of detecting said resonance signals by a three-dimensional imaging method by which the depthwise direction of said subject to be measured with a plurality of slice planes.

9. A method of magnetic resonance imaging according to claim 8, further comprising the step of correcting phase distortions for the first image signal data represented in complex numbers.

10. A method of magnetic resonance imaging according to claim 7, wherein said step (e) of processing comprises step of addition.

11. A method of magnetic resonance imaging according to claim 10, wherein said step of applying and detecting includes a step of detecting said resonance signals by a three-dimensional imaging method by which the depthwise direction of said subject to be measured with a plurality of slice planes.

12. A method of magnetic resonance imaging according to claim 11, further comprising the step of correcting phase distortions for the first image signal data represented in complex numbers.

* * * * *